United States Patent [19]  
Bertolina

[11] 4,455,448  
[45] Jun. 19, 1984

[54] HOUSING FOR MICROWAVE ELECTRONIC DEVICES

[75] Inventor: Robert W. Bertolina, Foster City, Calif.

[73] Assignee: Watkins-Johnson Company, Palo Alto, Calif.

[21] Appl. No.: 326,757

[22] Filed: Dec. 2, 1981

[51] Int. Cl.³ .............................................. H05K 9/00
[52] U.S. Cl. .............................. 174/35 R; 174/50.55; 174/51; 333/12; 333/260
[58] Field of Search ...................... 174/35 R, 71 C, 51, 174/50.55; 361/424; 333/12, 260

[56] References Cited

U.S. PATENT DOCUMENTS 1,960,938  5/1934  Forbes .......................... 174/35 C X
3,598,895  8/1971  Garland .......................... 174/35 C
3,829,770  8/1974  Stevens .......................... 333/116 X Primary Examiner—J. V. Truhe
Assistant Examiner—D. A. Tone
Attorney, Agent, or Firm—Flehr, Hohbach, Test, Albritton & Herbert

[57] ABSTRACT

A microwave device is housed in a plastic injected molded body which has been plated with an electrical conductor to provide shielding. Holes through the walls of the housing are plated and cooperatively function with electrical conductors as coaxial input and output lines.

6 Claims, 4 Drawing Figures

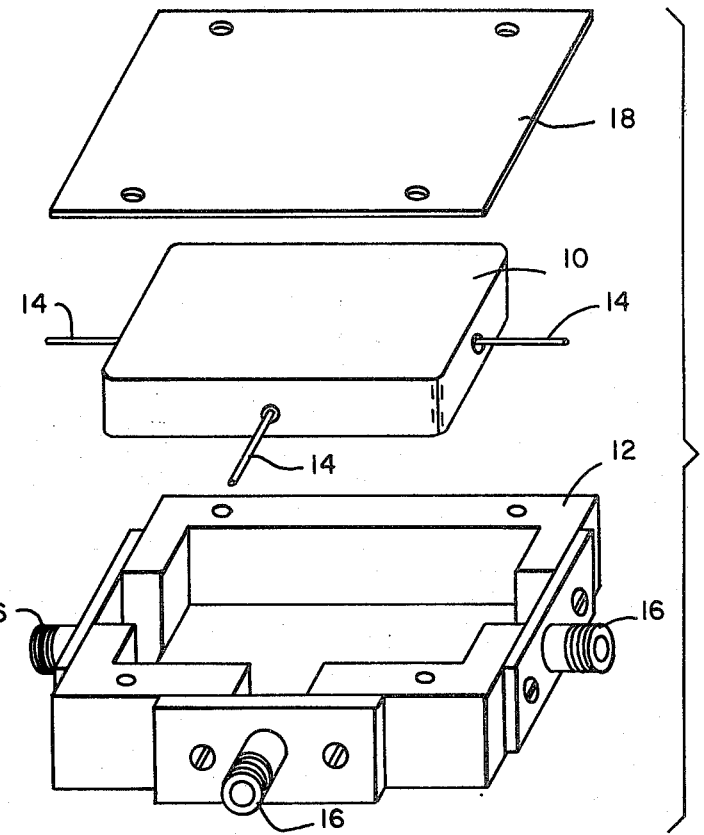
FIG.—1
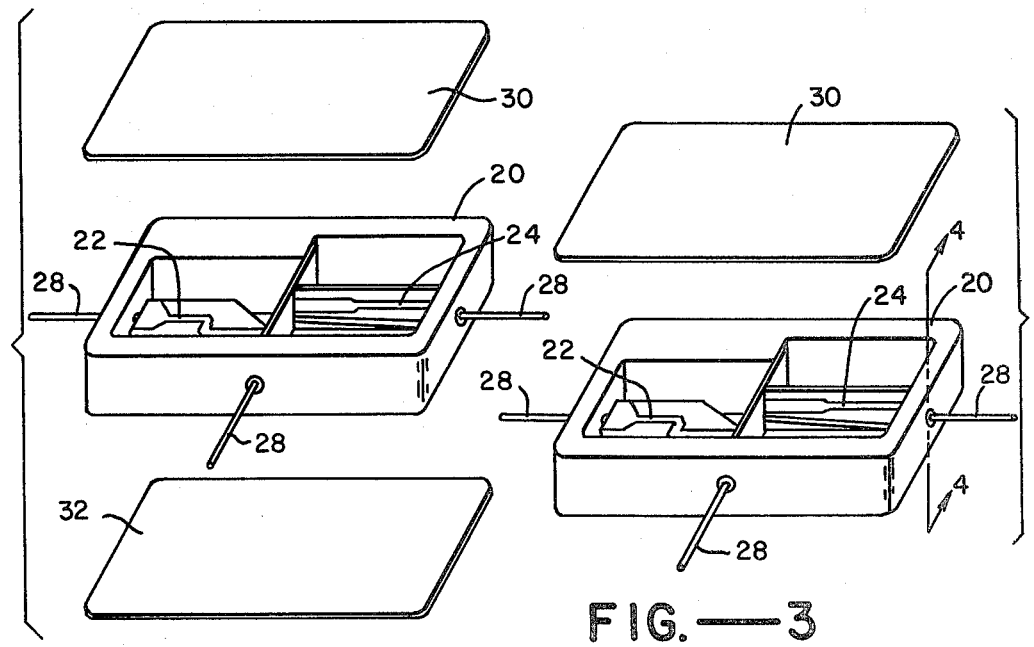
FIG.—2
FIG.—3

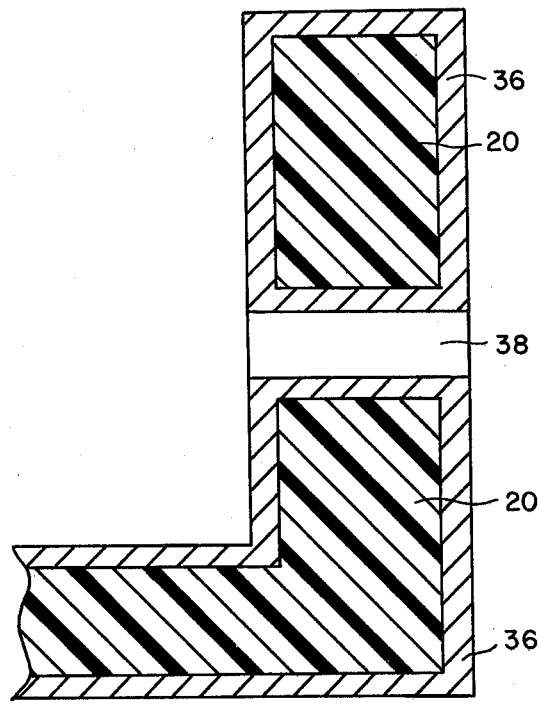
FIG.—4

HOUSING FOR MICROWAVE ELECTRONIC DEVICES

This invention relates generally to microwave electronic devices, and more particularly the invention relates to housings for microwave devices which are lightweight and inexpensive.

Microwave devices are typically mounted in an electrically conductive housing to provide electromagnetic shielding. Normally the housing is a metal frame which has been machined or cast in the desired configuration. In aerospace applications, however, weight is a critical consideration and metal housings are not satisfactory. Heretofore, metal coated glass cloth and plastics have been employed in place of metal waveguides in such applications. Further, U.S. Pat. No. 3,955,161 proposes the use of a plastic injection molded waveguide filter. However, a lightweight housing for varied uses in such microwave devices as mixers and amplifiers requiring coaxial connections for input and output signals has not been available.

Accordingly, an object of the present invention is an improved housing for use in microwave device applications.

Another object of the invention is a microwave device which is lightweight.

Still another object of the invention is a housing for a lightweight microwave device which is inexpensive.

A feature of the invention is a coaxial signal conduction line which is an integral part of the microwave device housing.

Briefly, in accordance with the invention a microwave housing comprises a molded plastic body having peripheral walls, a plurality of holes extending through the walls of the body, and electrically conductive material plated on the walls and in the holes. A bottom planar member having at least one electrically conductive surface and a top planar member having at least one conductive surface mate with the body and define a housing cavity for the microwave device. The bottom planar member can be injection molded separately or as an integral part of the body. Coaxial signal conductive lines extend through the holes and are integral therewith.

More particularly, each coaxial signal conduction line comprises a conductor extending through a hole and insulating material separating the conductor from the housing, the electrically conductive material plated in the hole comprising an outer conductor for the coaxial signal conduction line.

The invention and objects and features thereof will be more readily apparent from the following detailed description and appended claims when taken with the drawing, in which:

FIG. 1 is an exploded perspective view of a microwave device and package for use in coaxial applications.

FIG. 2 is an exploded perspective view of a microwave device and housing in accordance with one embodiment of the invention.

FIG. 3 is an exploded perspective view of a microwave device and housing in accordance with another embodiment of the invention.

FIG. 4 is a section view of a portion of the device taken along line 4—4 in FIG. 3 and illustrates plated material thereon.

Referring now to the drawing, FIG. 1 is an exploded perspective view of a microwave device 10 in a package 12 for employing the device 10 in coaxial applications. The device 10 has a plurality of leads 14 extending through the package which mate with coaxial connectors 16 mounted in the package 12. The device 10 is positioned within the cavity of package 12 and cover 18 mates with the top of package 12 to enclose the microwave device 10.

The device 10 has conventionally employed a metal housing such as Kovar, and the pins 14 extend through the walls of the metal housing with thermally matched glass seals insulating the pins from the metal housing. However, as described above, such metal housings increase the weight of the microwave device which is a detriment in aerospace applications. Further, the metal housings are relatively expensive.

FIG. 2 is a perspective view of a microwave device in housing 20 in accordance with one embodiment of the present invention. In this illustrative embodiment the microwave device comprises a mixer including microstrip planar members 22 and 24 which are electrically interconnected with the pins 28. In this embodiment a top planar member 30 and a bottom planar member 32 are separate from the body 20 and mate therewith to define the microwave device cavity.

In accordance with the invention the body 20 and the planar members 30 and 32 are injection molded plastic with at least one surface plated with a conductive material. In a preferred embodiment the plating comprises a first layer of copper which is deposited on the surfaces of the injection molded parts and a layer of gold is deposited on the copper. Conventional deposition techniques are employed with an initial layer of electroless copper being coated on the material and thereafter a thicker layer of copper plating is electrodeposited. A thin layer of gold or electroless nickel is then applied for corrosion resistance.

FIG. 3 is an exploded perspective view of another embodiment of the invention. This embodiment is similar to the embodiment of FIG. 2 and like elements have the same reference numerals. However, in this embodiment the bottom layer 32 is injection molded as an integral part of the body 20.

FIG. 4 is a section view of a portion of the body 20 taken along the line 4—4 in FIG. 3 which illustrates the plated metal 36 on the outer surfaces of the plastic body 20 and on the surface of the hole 38. As above described, the metal plating on the surface of the hole 38 functions as the outer (grounded) conductor of a coaxial feedthrough.

Advantageously, by plating the internal surface of the housing and the surfaces of the holes through the body 20, the plated material functions as the outer conductor of the coaxial feedthroughs. Accordingly, a separate coaxial line need not be inserted through the holes in the plastic material. It will be appreciated that the microwave device in the housing comprising body 20 and planar members 30 and 32 can be interconnected by coaxial lines with other circuit components without the need for the package 12 having the coaxial connectors. However, such a package may be advantageous where weight considerations are not important, such as in a laboratory environment.

Housings for microwave devices in accordance with the invention are lightweight and inexpensive. Advantageously, the coaxial feedlines can be formed as an integral part of the housing as described. While the invention has been described with reference to specific embodiments, the description is illustrative of the invention and is not to be construed as limiting the invention. Various modifications and applications may occur to those skilled in the art without departing from the true spirit and scope of the invention as defined by the appended claims.

What is claimed is:

1. For use in microwave applications, a housing comprising a molded plastic body having peripheral walls, a plurality of holes extending through walls of said body, an electrically conductive material plated on said walls and in said holes, a bottom planar member having at least one electrically conductive surface, a top planar member having at least one electrically conductive surface, said top and bottom planar members mating with said body and defining a housing cavity, and coaxial signal conductive lines extending through said holes.

2. The housing as defined by claim 1 wherein said bottom member is molded plastic material integral with said body.

3. The housing as defined by claim 1 or 2 wherein each of said coaxial signal conductive lines comprises a conductor extending through a hole and insulative material separating said conductor from said housing, said electrically conductive material plated in said holes comprising an outer conductor of said coaxial signal conduction line.

4. The housing as defined by claim 3 wherein said plating comprises a layer of copper and a layer of corrosion resistant material.

5. The housing as defined by claim 4 wherein said corrosion resistant material comprises gold.

6. The housing as defined by claim 4 wherein said corrosion resistant material comprises electroless nickel.

* * * * *